United States Patent [19]

Suzuki et al.

[11] Patent Number: 4,966,860
[45] Date of Patent: Oct. 30, 1990

[54] PROCESS FOR PRODUCING A SIC SEMICONDUCTOR DEVICE

[75] Inventors: Akira Suzuki, Nara; Katsuki Furukawa, Osaka, both of Japan

[73] Assignee: Sharp Kabushiki Kaisha, Osaka, Japan

[21] Appl. No.: 172,501

[22] Filed: Mar. 24, 1988

Related U.S. Application Data

[62] Division of Ser. No. 683,801, Dec. 19, 1984, Pat. No. 4,762,806.

[30] Foreign Application Priority Data

| Dec. 23, 1983 | [JP] | Japan | 58-252157 |
| Dec. 27, 1983 | [JP] | Japan | 58-249981 |
| Dec. 29, 1983 | [JP] | Japan | 58-246511 |

[51] Int. Cl.$^5$ .......................... H01L 21/265
[52] U.S. Cl. .......................... 437/31; 437/41; 437/32
[58] Field of Search .............. 437/100, 176, 203, 912, 437/913, 31; 357/61, 15, 22, 23.2, 34

[56] References Cited

U.S. PATENT DOCUMENTS

| 3,254,280 | 5/1966 | Wallace | 357/61 |
| 3,577,285 | 5/1971 | Rutz | 357/61 |
| 3,662,458 | 5/1972 | Formigoni et al. | 357/61 |
| 4,028,149 | 6/1977 | Deines et al. | 437/67 |
| 4,032,961 | 6/1977 | Baliga et al. | 357/57 |
| 4,068,134 | 1/1978 | Tobey, Jr. et al. | 357/16 |
| 4,531,142 | 7/1985 | Weyrich et al. | 357/17 |
| 4,582,561 | 4/1986 | Ioku et al. | 156/624 |
| 4,757,028 | 7/1988 | Kondoh et al. | 437/40 |

FOREIGN PATENT DOCUMENTS

| 55-24482 | 2/1980 | Japan | 437/21 |

OTHER PUBLICATIONS

Nishino et al., "Blue-Emitting Diodes of 6H–SiC Prepared by Chemical Vapor Deposition", Japanese Journal of Applied Physics, vol. 19, No. 7, Jul. 1980, pp. L353–L356.
Matsunami et al., "Heteroepitaxial Growth of —SiC on Silicon Substrate Using SiCl$_4$—C$_3$—H$_8$—H$_2$ System", Journal of Crystal Growth, vol. 42, 1978, pp. 138–143.
Nishino et al., "Production of Large-Area Single-Crystal Wafers of Cubic SiC for Semiconductor Devices", Applied Physics Letter, vol. 42, No. 5, Mar. 1983, pp. 460–462.

*Primary Examiner*—Olik Chaudhuri
*Attorney, Agent, or Firm*—Spencer & Frank

[57] ABSTRACT

A process for producing a SiC semiconductor device comprising growing a single-crystal film of SiC on a single-crystal substrate of Si and forming the structure of semiconductor device such as diodes, transistors, etc., on said SiC single-crystal film, thereby obtaining a SiC semiconductor device on a commercial scale.

14 Claims, 3 Drawing Sheets

PROCESS FOR PRODUCING A SIC SEMICONDUCTOR DEVICE

This is a Division of application Ser. No. 06/683,801 filed Dec. 19th, 1984, now U.S. Pat. No. 4,762,806.

Conventional diodes and transistors have been produced on a laboratory scale using a SiC single-crystal grown by sublimation (i.e., the Lely method) or the like, and/or a SiC single-crystal film epitaxially grown by chemical vapor deposition, liquid phase epitaxy, etc., on the SiC single-crystal, which are disclosed in R.B. Campbell and H.-C.Chang, "Silicon Carbide Junction Devices", in "Semiconductors and Semimetals", eds. R.K. Willardson and A.C. Beer (Academic Press, New York, 1971) vol. 7, Part B, Chap. 9, P.625–P.683. However, these conventional techniques only provide single-crystals having a small surface area and, moreover, cannot provide single-crystals of a desired size and/or shape. Moreover, with use of these conventional techniques, it is difficult to control the polytype of single-crystals and the concentration of impurities contained in the SiC crystals. Therefore, it is impossible to produce semiconductor devices using SiC single-crystals on a commercial scale.

In recent years, the inventors have completed a process for growing a large-sized single-crystal of silicon carbide of good quality on a single-crystal substrate of silicon by the chemical vapor deposition technique and filed a Japanese Patent Application No. 58-76842 (76842/1983) which corresponds to U.S. Pat. No. 4,623,425. This process includes growing a thin film of silicon carbide on a silicon substrate by the CVD method at a low temperature and then growing a single-crystal film of silicon carbide on the said thin film by the CVD method at a higher temperature, thereby allowing the production of a large-sized single-crystal substrate of silicon carbide having a high quality on a single-crystal substrate of silicon which is available at a low cost while controlling the polytype, the concentration of impurities, the electric conductivity, the size, the shape or the like of single-crystals. This process is also suitable for the mass-production of such a SiC single-crystal film with high productivity.

SUMMARY OF THE INVENTION

The process of this invention which overcomes the above-discussed and numerous other disadvantages and deficiencies of the prior art, comprises growing a single-crystal film of SiC on a single-crystal substrate of Si and forming the structure of semi-conductor devices such as diodes, transistors, etc., on said SiC single-crystal film.

The SiC single-crystal film is, in preferred embodiment, grown on said Si single-crystal substrate by the chemical vapor deposition method.

A mixture of monosilane gas and propane gas is, in preferred embodiment, supplied as a source gas to the surface of said Si single-crystal substrate with hydrogen gas as a carrier gas.

A portion in said SiC single-crystal film is exposed by an etching treatment to position emitter, collector and base electrodes, respectively, thereon, resulting in a SiC bipolar transistor. The etching treatment is, in preferred embodiment, carried out by a photolithography method.

Channel regions are formed on said SiC single-crystal film to position source, drain and gate electrodes, respectively, thereon.

Thus, the invention described herein makes possible the objects of (1) providing a process for mass-producing a SiC semiconductor device on a commercial scale; and (2) providing the possibility of an enlarged range of applications of the said SiC semiconductor device by utilizing the excellent characteristics thereof such as the thermal, chemical and mechanical stability which other semiconductors such as Si, GaAs, GaP, etc., do not have.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

A bipolar transistor and a field effect transistor are produced as follows:

(1) Bipolar transistor:

FIGS. 1(A) to 1(G) show the production process of a SiC bipolar transistor according to this invention, wherein a SiC single-crystal film is grown on a Si single-crystal substrate by the chemical vapor deposition (CVD) method which was created by the inventors as described in the "Description of the prior art."

Figure 1A:
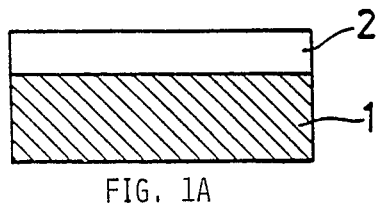
FIGS. 1(A) to 1(G), respectively, are diagramatical sectional views showing the production process of a bipolar transistor according to this invention.
Figure 1E:
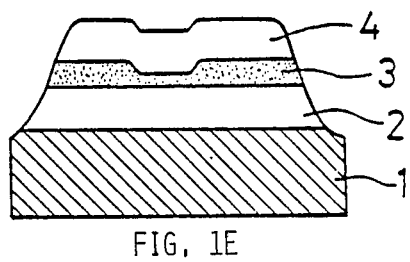
Figure 1B:
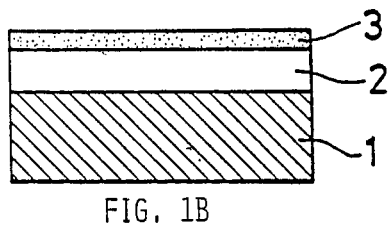
Figure 1F:
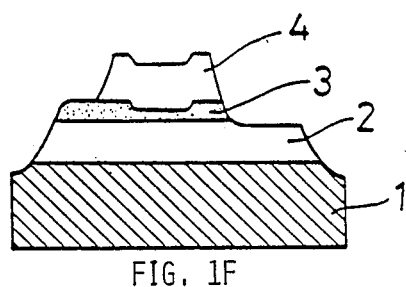
Figure 1C:
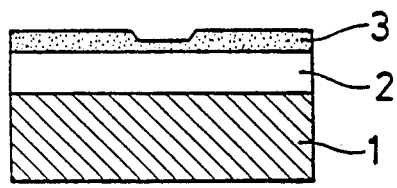
Figure 1G:
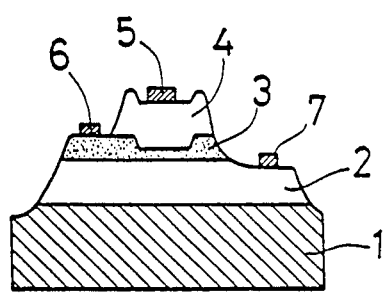
Figure 1D:
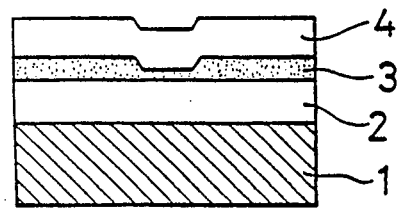

According to this invention, a Si single-crystal substrate 1 is placed within a reactor tube, first, and, then, as a source gas, a mixture of a silicon gas (such as $SiH_4$) and a carbon gas (such as $C_3H_8$) and a carrier gas (such as hydrogen gas) are supplied to the reactor tube for about 1 hour, resulting in an n-SiC single-crystal film 2 having a thickness of approximately 2 $\mu$m on the Si substrate 1 as shown in FIG. 1(A). Then, a p-SiC single-crystal film 3 is grown on the n-SiC single-crystal film 2 as shown in FIG. 1(B) and etched by a photolithography method to form a groove which serves as a base region having a thickness of 0.5 to 1.0 $\mu$m as shown in FIG. 1(C). On the p-SiC single-crystal film 3, an n-SiC single-crystal film 4 is grown, as shown in FIG. 1(D), with a thickness of approximately 2 $\mu$m. The outer regions of the n-SiC single-crystal film 4, the p-SiC single-crystal film 3 and the n-SiC single-crystal film 2 are mesa-etched by a photolithography method as shown in FIG. 1(E). Then, by the same etching technique as mentioned above, the end portions of both the n-SiC single-crystal film 4 and the p-SiC single-crystal film 3 are removed to form terraced growth portions as shown in FIG. 1(F). An emitter electrode 5 and a collector electrode 7, both of which are made of nickel, are vapor-deposited on the groove of the n-SiC single-crystal film 4 and the terrace of the n-SiC single-crystal film 2, respectively, and a base electrode 6 which is made of an aluminum-silicon (Al-Si) alloy is vapor-deposited on the exposed surface of the p-SiC single-crystal film 3 as shown in FIG. 1(G). Lead wires are connected to each of the electrodes 5, 6 and 7, resulting in a n-p-n type bipolar transistor in which the n-SiC single-crystal film 4 functions as an emitter, the p-SiC single-crystal film 3 functions as a base and the n-SiC single-crystal film 2 as a collector.

Diborane gas, $AlCl_3$ gas, an organic Al gas, or the like are used as p-type impurities, while $PH_3$ gas, $N_2$ gas, $NH_3$ gas, or the like are used as n-type impurities to be added as dopants to the SiC single-crystal films.

In the above-mentioned example, the CVD method was used for the growth of SiC single-crystal films on a Si single-crystal substrate and/or for the growth of different conductive type SiC single-crystal films on a SiC single-crystal film, but other growth methods such as liquid phase epitaxy can be also used therefor. The emitter, the base and the collector regions can be formed by known processes (e.g., an impurity diffusion process, an ion implantation process, etc.), which are used for the production of transistors made of Si semiconductors. Electrode materials for the emitter, the base and the collector regions are, of course, not limited to the above-mentioned.

Although the production of a SiC bipolar transistor having a basic structure was exemplified in the above, bipolar transistors of an improved or developed structure, which have been applied to bipolar transistors made of Si semiconductors, and/or other bipolar transistors, which have been used for integrated circuits (IC), large scale integration (LSI) circuits and very large scale integration (VLSI) circuits obtained from these improved and/or developed structures, can be produced according to the process for the production of SiC bipolar transistors of this invention.

Figure 2A:
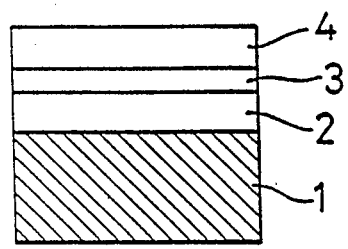
FIGS. 2(A) to 2(C), respectively, are diagramatical sectional views showing the production process of a junction gate type field effect transistor according to this invention.
Figure 2B:
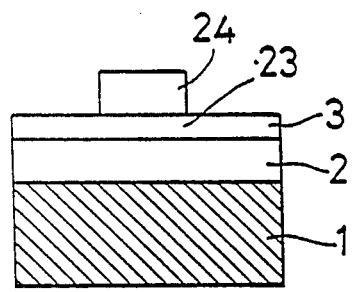
Figure 2C:
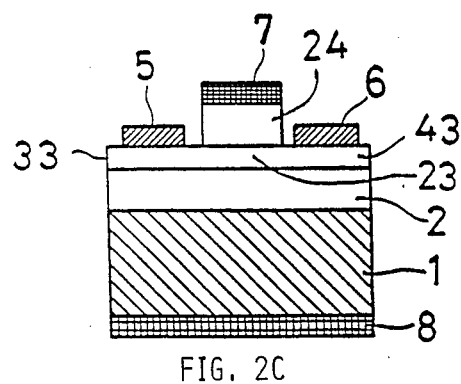

(2) Field effect transistor:

FIGS. 2 to 4, respectively, show the production process of a SiC field effect transistor according to this invention, wherein a SiC single-crystal film 2 is, first, grown on a Si single-crystal substrate 1 by the CVD method in which a mixture of a silicon gas (such $SiH_4$) and a carbon gas (such as $C_3H_8$) as a source gas and a carrier gas (such as hydrogen gas) are supplied to a reactor tube for 30 minutes to 1 hour to form a SiC single-crystal film having a thickness of 0.5 to 2 $\mu m$. Source, gate and drain regions are formed in or on the SiC single-crystal film, resulting in a field effect transistor. Each of the field effect transistors of a junction gate type, a Schottky barrier gate type, and an insulated gate type is explained below:

(2.1) Junction gate type field effect transistors:

FIGS. 2(A) to 2(C) show the production process of a junction gate type field effect transistor. Using the above-mentioned crystal growth method, a p-type SiC single-crystal film 2 having a thickness of about 1 to 2 $\mu m$, an n-type SiC single-crystal film 3 having a thickness of about 0.5 to 1 $\mu m$ and a p-type SiC single-crystal film 4 are successively formed on a p-type Si single-crystal substrate 1 as shown in FIG. 2(A). Then, the p-type SiC single-crystal film 4 is etched by a photolithography method in such a manner that the center portion of the p-type single-crystal film 4 on the center portion 23 of the n-type single-crystal film 3 remains to form a mesa portion 24 as shown in FIG. 2(B). A source electrode 5 and a drain electrode 6, both of which are made of nickel as an ohmic electrode material, are vapor-deposited, using a masking means, on the source region 33 and the drain region 43, respectively, each of which is positioned at the end of the n-type SiC single-crystal film 3. A gate electrode 7 made of an aluminum-silicon (Al-Si) alloy as an ohmic electrode material is vapor-deposited on the mesa portion 24 of the p-type SiC single-crystal film 4 and then a back electrode 8 made of nickel as an ohmic electrode material is formed on the Si substrate 1 by a plating technique. Lead wires are connected to each of the electrodes 5, 6, 7 and 8, resulting in a junction gate type field effect transistor as shown in FIG. 2(C). Diborane gas, $AlCl_3$ gas, an organic Al gas, or the like are used as p-type impurities, while, as n-type impurities, $PH_3$ gas, $N_2$ gas, $NH_3$ gas, or the like are used. These impurities are fed as a carrier gas to the reactor tube to be doped within the SiC single-crystals.

Figure 3A:
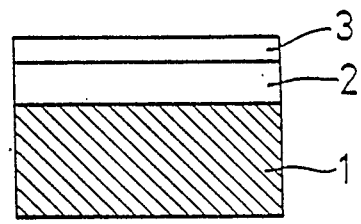
FIGS. 3(A) to 3(C), respectively, are diagramatical sectional views showing the production process of a Schottky barrier gate type field effect transistor according to this invention.
Figure 3B:
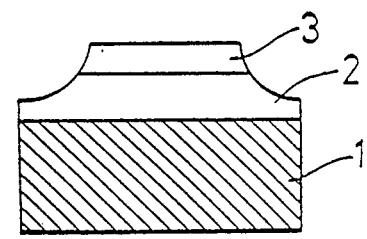
Figure 3C:
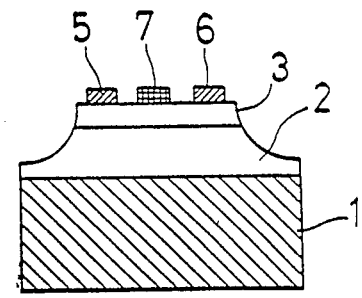

(2.2) Schottky barrier gate type field effect transistors:

FIGS. 3(A) to 3(C) show the production process of a Schottky barrier gate type field effect transistor according to this invention. As shown in FIG. 3(A), using the above-mentioned crystal growth method, a p-type SiC single-crystal film 2 having a thickness of several $\mu m$ and an n-type SiC single-crystal film 3 having a thickness of about 0.5 to 1 $\mu m$ are successively grown on a p-type Si single-crystal substrate 1. The lamination is mesaetched by an etching technique using a photolithography method to remove the outer regions of both of the n-type and the p-type SiC single-crystal films 3 and 2, thereby retaining only the active region of the n-type SiC single-crystal film 3, as shown in FIG. 3(B). A source electrode 5 and a drain electrode 6, both of which are made of nickel as an ohmic electrode material, are, respectively, vapor-deposited on the end portion of the active region of the n-type SiC single-crystal film 3. A Schottky barrier gate electrode 7 made of gold is vapor-deposited on the active region of the film 3 between the source and the drain electrodes 5 and 6. Lead wires are then connected to each of the electrodes 5, 6 and 7, respectively, resulting in a Schottky barrier gate type field effect transistor, as shown in FIG. 3(C).

Figure 4A:
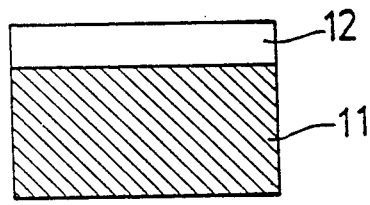
FIGS. 4(A) to 4(E), respectively, are diagramatical sectional views showing the production process of an insulated gate type field effect transistor according to this invention.
Figure 4B:
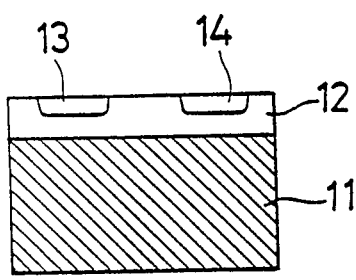
Figure 4C:
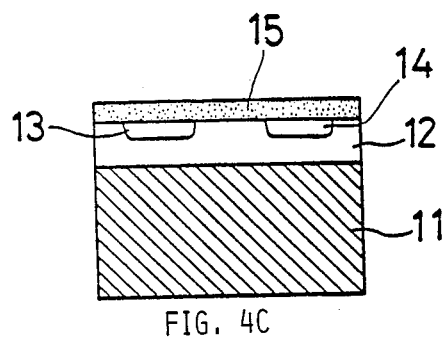
Figure 4D:
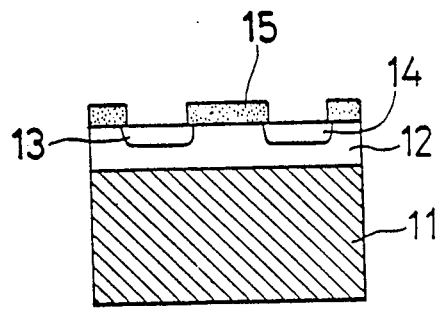
Figure 4E:
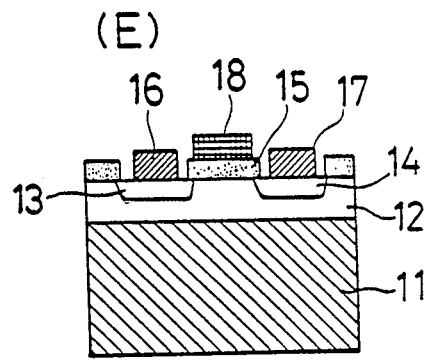

(2.3) Insulated gate type field effect transistors:

FIGS. 4(A) to 4(E) show the production process of an insulated gate type field effect transistor according to this invention. As shown in FIG. 4(A), using the above-mentioned crystal growth method, a p-type SiC single-crystal film 12 having a thickness of several $\mu m$ is grown on an n-type Si single-crystal substrate 11, first. Then, using a masking means, nitrogen ions are implanted within the SiC single-crystal film 12 to form n-type regions, each of which serves as a source region 13 and a drain region 14, as shown in FIG. 4(B). Then, the surface of the SiC single-crystal film 12 is subjected to a thermal-oxidation treatment to form a silicon dioxide ($SiO_2$) film 15 having a thickness of about 1,000 Å as an insulation film as shown in FIG. 4(C). The portion of the $SiO_2$ film 15 which is positioned on the source and the drain regions 13 and 14 is removed by an etching technique using a usual photolithography method to thereby expose the source and the drain regions 13 and 14 as shown in FIG. 4(D). A source electrode 16 and a drain electrode 17, both of which are made of nickel as an ohmic electrode material, are, respectively, vapor-deposited on the source region 13 and the drain region 14. A gate electrode 18 made of aluminum is vapor-deposited on the $SiO_2$ film 15 between the source and the drain electrodes 16 and 17. Lead wires are then connected to each of the electrodes 16, 17 and 18, resulting in an insulated gate type field effect transistor.

In this example, the CVD method was used for the growth of SiC single-crystal films on a Si single-crystal substrate and/or for the growth of different conductive type SiC single-crystal films on a SiC single-crystal film, but other growth methods such as liquid phase epitaxy can be also used therefor. The source, the drain and the gate regions in each of the above-mentioned field effect transistors can be formed by known processes (e.g., an impurity diffusion process, an ion implantation process, etc.), which are used for the production of field effect transistors made of Si semiconductors, GaAs semiconductors, or the like. Electrode materials for the source, the drain and the gate regions are, of course, not limited to the above-mentioned. Also, the gate insulation film of the insulated gate type field effect transistor is, of course, not to silicon dioxide Although the production of a field effect transistor having a basic structure was exemplified in the above, field effect transistors of improved or developed structures, which have been applied to field effect transistors made of Si semiconductors, GaAs semiconductors, etc., and/or other field effect transistors, which have been used for an integrated circuits (IC), large scale integration (LSI) circuits and very large scale integration (VLSI) circuits obtained from these transistors of the improved or developed structure, can be produced according to the process for the production of SiC field effect transistors of this invention.

The above-described processes for the production of transistors are only an example of the production process of this invention. Semiconductor devices (such as a variety of diodes, transistors, light emitting diodes, lasers, charge coupled devices (CCD), etc., made of semiconductor materials including Si semiconductors); and IC, LSI, and VLSI (which are obtained by the integration of these semiconductor devices) can be easily produced according to the process of this invention.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A process for producing a SiC bipolar transistor disposed on a single-crystal Si substrate, comprising the following steps:
   growing at least one single crystal film of SiC on a single crystal substrate of Si while providing three regions of alternating opposite conductivity types in said SiC single-crystal film to form the entire operational area of a bipolar transistor in said SiC single-crystal film disposed on said Si substrate; and
   forming electrodes for said bipolar transistor on said SiC single-crystal film by etching said SiC single-crystal film to expose portions of each of said three regions, and positioning emitter, collector and base electrodes, respectively, on said exposed portions of said three regions to produce a bipolar transistor in said SiC single-crystal film disposed on said Si single-crystal substrate.

2. A process according to claim 1, wherein etching is carried out by a photolithography method.

3. A process as defined in claim 1 wherein: said SiC single-crystal film includes three superimposed layers of alternatingly opposite conductivity types to form said three regions.

4. A process for producing an insulated gate field effect transistor, comprising the following steps:
   growing a SiC single-crystal film of one conductivity type on a Si single-crystal substrate of the opposite conductivity type;
   implanting impurity ions of said opposite conductivity type within said SiC single-crystal film to form source and drain regions of said opposite conductivity type;
   thermally oxidizing the surface of said SiC single-crystal film to form a silicon dioxide film;
   removing a portion of said silicon dioxide film positioned on said source and drain regions to expose said source and drain regions; and,
   forming a source electrode on said source region, a drain electrode on said drain region, and a gate electrode on said silicon dioxide film between said source and drain electrodes.

5. The process of forming an insulated gate field effect transistor according to claim 4, wherein said SiC single-crystal film is grown by chemical vapor deposition.

6. The process for producing an insulated gate field effect transistor according to claim 4, wherein said SiC single-crystal film is grown by liquid phase epitaxy.

7. The process for producing an insulated gate field effect transistor according to claim 4, wherein said one type of conductivity is p-type.

8. The process for producing an insulated gate field effect transistor according to claim 4, wherein nitrogen ions are implanted as said impurity ions within said SiC single-crystal film.

9. A process for producing a bipolar transistor disposed on a Si single-crystal substrate, comprising the steps of:
   growing a first SiC single-crystal film of one conductivity type on a Si single-crystal substrate;
   forming a second SiC single-crystal film of the opposite conductivity type on said first film;
   etching said second film to form a groove which serves as a base region;
   forming a third SiC single-crystal film of said one conductivity type on said second film;
   etching said first, said second, and said third films to form a mesa shaped portion of said films on said substrate;
   etching said second and said third films along the side surface of said mesa shaped portion to expose a portion of the surface of said first film and a portion of the surface of said second film, with said exposed portions of said first and second films being on opposite sides of said mesa shaped portion;
   forming respective emitter and collector electrodes on the exposed surface of said third film above said groove and on the exposed surface portion of said first film; and
   forming a base electrode on the exposed surface portion of said second film.

10. A process for producing a bipolar transistor according to claim 9, wherein said one type of conductivity is n-type.

11. A process for producing a bipolar transistor according to claim 9, wherein said step of forming respective emitter and collector electrodes and said step of forming a base electrode include vapor depositing metal onto the respective exposed surface portions of said third and said first films and onto the exposed surface of said second film respectively.

12. A process for producing a bipolar transistor according to claim 11, wherein said emitter and collector electrodes are formed of nickel and said base electrode is formed of an aluminum-silicon alloy.

13. A process for producing a bipolar transistor according to claim 9, wherein said SiC single-crystal films are grown on said Si single-crystal substrate by the chemical vapor deposition method.

14. A process for producing a bipolar transistor according to claim 13, wherein during said vapor deposition method, a mixture of monosilane gas and propane gas is supplied as source gas to the surface of said Si single-crystal substrate with hydrogen gas as a carrier gas.

* * * * *